United States Patent
Socha

(10) Patent No.: US 7,493,589 B2
(45) Date of Patent: Feb. 17, 2009

(54) METHOD, PROGRAM PRODUCT AND APPARATUS FOR MODEL BASED GEOMETRY DECOMPOSITION FOR USE IN A MULTIPLE EXPOSURE PROCESS

(75) Inventor: Robert John Socha, Campbell, CA (US)

(73) Assignee: ASML Masktools B.V., A.H. Veldhoven (NL)

( * ) Notice: Subject to any disclaimer, the term of this patent is extended or adjusted under 35 U.S.C. 154(b) by 272 days.

(21) Appl. No.: 11/496,742

(22) Filed: Aug. 1, 2006

(65) Prior Publication Data

US 2007/0157154 A1 Jul. 5, 2007

Related U.S. Application Data

(60) Provisional application No. 60/776,199, filed on Feb. 24, 2006, provisional application No. 60/754,312, filed on Dec. 29, 2005.

(51) Int. Cl.
G06F 17/50 (2006.01)
G03F 1/00 (2006.01)

(52) U.S. Cl. .................... 716/21; 716/19; 430/5
(58) Field of Classification Search ............ 716/19, 716/21; 430/5
See application file for complete search history.

(56) References Cited

U.S. PATENT DOCUMENTS

| 4,894,790 A | 1/1990 | Yotsuya et al. |
| 5,097,138 A | 3/1992 | Wakabayashi et al. |
| 5,307,296 A | 4/1994 | Uchida et al. |

(Continued)

FOREIGN PATENT DOCUMENTS

EP 1 329 771 7/2003

(Continued)

OTHER PUBLICATIONS

Pati Y.C. et al. "Exploiting Structure in Fast Aerial Image Computation for Integrated Circuit Patterns." IEEE Transactions on Semiconductor Manufacturing, Feb. 1997, IEEE, USA, vol. 10, No. 1, pp. 62-74, XP002256517.

(Continued)

*Primary Examiner*—Jack Chiang
*Assistant Examiner*—Magid Y Dimyan
(74) *Attorney, Agent, or Firm*—Pillsbury Winthrop Shaw Pittman LLP

(57) ABSTRACT

A method of decomposing a target pattern having features to be imaged on a substrate so as to allow said features to be imaged in a multi-exposure process. The method includes the steps of: (a) segmenting a plurality of the features into a plurality of polygons; (b) determining the image log slope (ILS) value for each of the plurality of polygons; (c) determining the polygon having the minimum ILS value, and defining a mask containing the polygon; (d) convolving the mask defined in step (c) with an eigen function of a transmission cross coefficient so as to generate an interference map, where the transmission cross coefficient defines the illumination system to be utilized to image the target pattern; and (e) assigning a phase to the polygon based on the value of the interference map at a location corresponding to the polygon, where the phase defines which exposure in said multi-exposure process the polygon is assigned.

14 Claims, 17 Drawing Sheets

U.S. PATENT DOCUMENTS

| | | | |
|---|---|---|---|
| 5,307,421 | A | 4/1994 | Darboux et al. |
| 5,319,564 | A | 6/1994 | Smayling et al. |
| 5,416,729 | A | 5/1995 | Leon et al. |
| 5,621,652 | A | 4/1997 | Eakin |
| 5,795,688 | A | 8/1998 | Burdorf et al. |
| 5,825,647 | A | 10/1998 | Tsudaka |
| 5,966,312 | A | 10/1999 | Chen |
| 5,969,441 | A | 10/1999 | Loopstra et al. |
| 6,046,792 | A | 4/2000 | Van Der Werf et al. |
| 6,081,659 | A | 6/2000 | Garza et al. |
| 6,289,499 | B1 | 9/2001 | Rieger et al. |
| 6,355,382 | B1 * | 3/2002 | Yasuzato et al. ............ 430/5 |
| 6,492,066 | B1 * | 12/2002 | Capodieci et al. ............ 430/5 |
| 7,065,738 | B1 * | 6/2006 | Kim ........................ 716/19 |
| 7,155,689 | B2 * | 12/2006 | Pierrat et al. ................. 716/4 |
| 7,398,508 | B2 * | 7/2008 | Shi et al. ..................... 716/19 |
| 2003/0118917 | A1 * | 6/2003 | Zhang et al. .................. 430/5 |
| 2003/0126581 | A1 | 7/2003 | Pang et al. |
| 2004/0123265 | A1 * | 6/2004 | Andreev et al. .............. 716/21 |
| 2005/0044513 | A1 * | 2/2005 | Robles et al. .................. 716/4 |
| 2005/0142449 | A1 * | 6/2005 | Shi et al. ...................... 430/5 |
| 2005/0268256 | A1 * | 12/2005 | Tsai et al. ..................... 716/4 |
| 2007/0031745 | A1 * | 2/2007 | Ye et al. ...................... 430/30 |

FOREIGN PATENT DOCUMENTS

EP         1465016         10/2004

OTHER PUBLICATIONS

Mack C A . et al "Metrology, Inspection, and Process Control for Microlithography XV." Santa Clara CA, Feb. 26, 2001-Mar. 1, 2001, vol. 4344, pp. 377-384, XP 008022568.

Cobb N, et al. "Mathematical and CAD Framework for Proximity Correction." Optical Microlithography IX, Santa Clara, CA, Mar. 13-15, 1996, vol. 2726, pp. 208-222, XP008022569.

Yeung M.S., et al. "Extension of the Hopkins theory of partially coherent imaging to include thin-film interference effects" 452/SPIE vol. 1927 Optical/Laser Microlithography VI (1993).

Randall J. et al. "Variable Threshold Resist Models for Lithography Simulation" XP008001832, PD Mar. 17, 1999, pp. 176-182.

Crisalle O.D.. et al., "A Comparison of the Optical Projection Lithography Simulators in Sample and Prolith" IEEE Translations on Semiconductior MA, vol. 5, No. 1. Feb. 1992.

Gopalarao K. S. V. et al., "An Integrated Technology CAD System for Process and Device Designers", IEEE Transactions on Very Large Scale Integration (VLSI) Systems, vol. 1, No. 4, Dec. 1993.

Neubauer, G. et al., "Imaging VLSI Cross Sections by Atomic Force Microscopy", CH3084-1/92/0000-0299$01.00 @ 1992 IEEE/IRPS.

Rodgers M., "Application of the Atomic Force Microscope to Integrated Circuit Reliability and Failure Analysis", CH2974-4/91/0000-0250$01.00 @ 1991 IEEE/IRPS.

Qian Q.E. et al., "A New Scalar Planewave Model for High NA Lithography Simulations", TH0640-3/94/0000-0045 $3.00 @1994 IEEE.

Barouch E. et al., "Modeling Process Latitude in UV Projection Lithography", vol. 12, No. 10, Oct. 1991.

Peters L. "AFMs: What Will Their Role Be?" 62/Semiconductor International Aug. 1993.

* cited by examiner

METHOD, PROGRAM PRODUCT AND APPARATUS FOR MODEL BASED GEOMETRY DECOMPOSITION FOR USE IN A MULTIPLE EXPOSURE PROCESS

RELATED APPLICATIONS

This application claims priority to U.S. patent application Ser. No. 60/754,312, filed on Dec. 29, 2005, and to U.S. patent application Ser. No. 60/776,199 filed on Feb. 24, 2006, both of which are incorporated by reference herein in their entirety.

TECHNICAL FIELD

The technical field of the present invention relates generally to a method, program product and apparatus for performing a model based decomposition of a target pattern so as to allow the target pattern to be imaged utilizing, for example, multiple masks in a multiple illumination process.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As the critical dimensions of the target patterns become increasingly smaller, it is becoming increasingly harder to reproduce the target patterns on the wafer. However, there are known techniques that allow for a reduction in the minimum CD that can be imaged or reproduced in a wafer. One such technique is the double exposure technique wherein features in the target pattern are imaged in two separate exposures.

For example, one commonly known double exposure technique is dipole illumination. In this technique, during a first exposure the vertical edges of the target pattern (i.e., features) are illuminated and then during a second exposure the horizontal edges of the target pattern are illuminated. As noted, by utilizing two exposures, improved imaging performance may be obtained.

Another known double exposure technique allows the features of a given target pattern to be separated into two different masks and then imaged separately to form the desired pattern. Such a technique is typically utilized when the target features are spaced so closely together that it is not possible to image the individual features. In such a situation, as noted, the target features are separated into two masks such that all the features on a given mask are spaced sufficiently apart from one another so that each feature may be individually imaged. Then, by imaging both masks in a sequential manner (with the appropriate shielding), it is possible to obtain the target pattern having the densely spaced features that could not be properly imaged utilizing a single mask.

Thus, by separating the target features into two separate masks, such that the pitch between each of the features on a given mask is above the resolution capabilities of the imaging system, it is possible to improve imaging performance. Indeed, the above-mentioned double exposure techniques allow for a $k_1 < 0.25$. However, problems and limitations still exist with currently known double exposure techniques.

For example, current decomposition algorithms treat each piece of geometry in the target design/pattern as one unit, and none of these units are automatically decomposed into multiple segments. As a result, for certain target patterns, even though double exposure techniques are utilized, it is not possible to obtain a $k_1 < 0.25$.

Another problem associated with current decomposition algorithms is that they are primarily rule based algorithms, which require an excessive number of rules to handle today's increasingly complex designs. Moreover, often times there are situations/conflicts within the design for which no rule has been defined, and such instances can result in the algorithm failing to find a suitable result.

It is an object of the present invention to overcome such deficiencies in known double exposure techniques.

SUMMARY OF THE INVENTION

In view of the foregoing, it is an object of the present invention to overcome the deficiencies of known prior art techniques by providing a model based process for decomposing (i.e., coloring) the features of a target pattern into distinct segments which are imaged separately, for example, by utilizing multiple masks. In addition, the model based coloring process allows for a single feature of the target pattern to be separated/divided into multiple segments which can be imaged in separate exposures.

In summary, the present invention provides a model based coloring process that allows for decomposition of the target pattern into multiple reticles which are illuminated utilizing multiple exposures. The model based coloring process, when necessary, automatically provides for decomposition of single geometries of the target pattern into multiple segments, which can be imaged in separate masks using double (or multiple) exposures. The total image is the union of all the exposures (i.e., the original target design is created by stitching the images created by multiple exposures).

More specifically, the present invention relates to a method of decomposing a target pattern having features to be imaged on a substrate so as to allow the features to be imaged in a multi-exposure process. The method includes the steps of: (a) segmenting a plurality of the features into a plurality of polygons; (b) determining the image log slope (ILS) value for each of the plurality of polygons; (c) determining the polygon having the minimum ILS value, and defining a mask containing the polygon; (d) convolving the mask defined in step (c) with an eigen function of a transmission cross coefficient so as to generate an interference map, where the transmission cross coefficient defines the illumination system to be utilized to image the target pattern; and (e) assigning a phase to the polygon based on the value of the interference map at a location corresponding to the polygon, where the phase defines which exposure in said multi-exposure process the polygon is assigned.

The present invention provides important advantages over the prior art. Most importantly, the present invention provides a model based coloring process for decomposing the features of a target pattern into distinct segments which can be imaged separately, for example, by utilizing multiple masks. In addition, the model based coloring process of the present invention allows for a single feature of the target pattern to be automatically separated/divided into multiple segments which can be also be imaged separately. Furthermore, the method of the present invention advantageously can achieve a $k_1$ of 0.195.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE INVENTION

As explained in more detail below, the model based coloring process decomposes a target pattern into multiple segments which are illuminated separately in a multiple exposure process. In one embodiment, the multiple segments are assigned and included in one of two separate reticles, which are subsequently illuminated. Furthermore, as shown in the examples disclosed herein, the model based coloring process, when necessary, automatically provides for decomposition of single geometry (i.e., feature) in the target pattern into multiple segments, which are then imaged in separate illumination processes.

Figure 1:
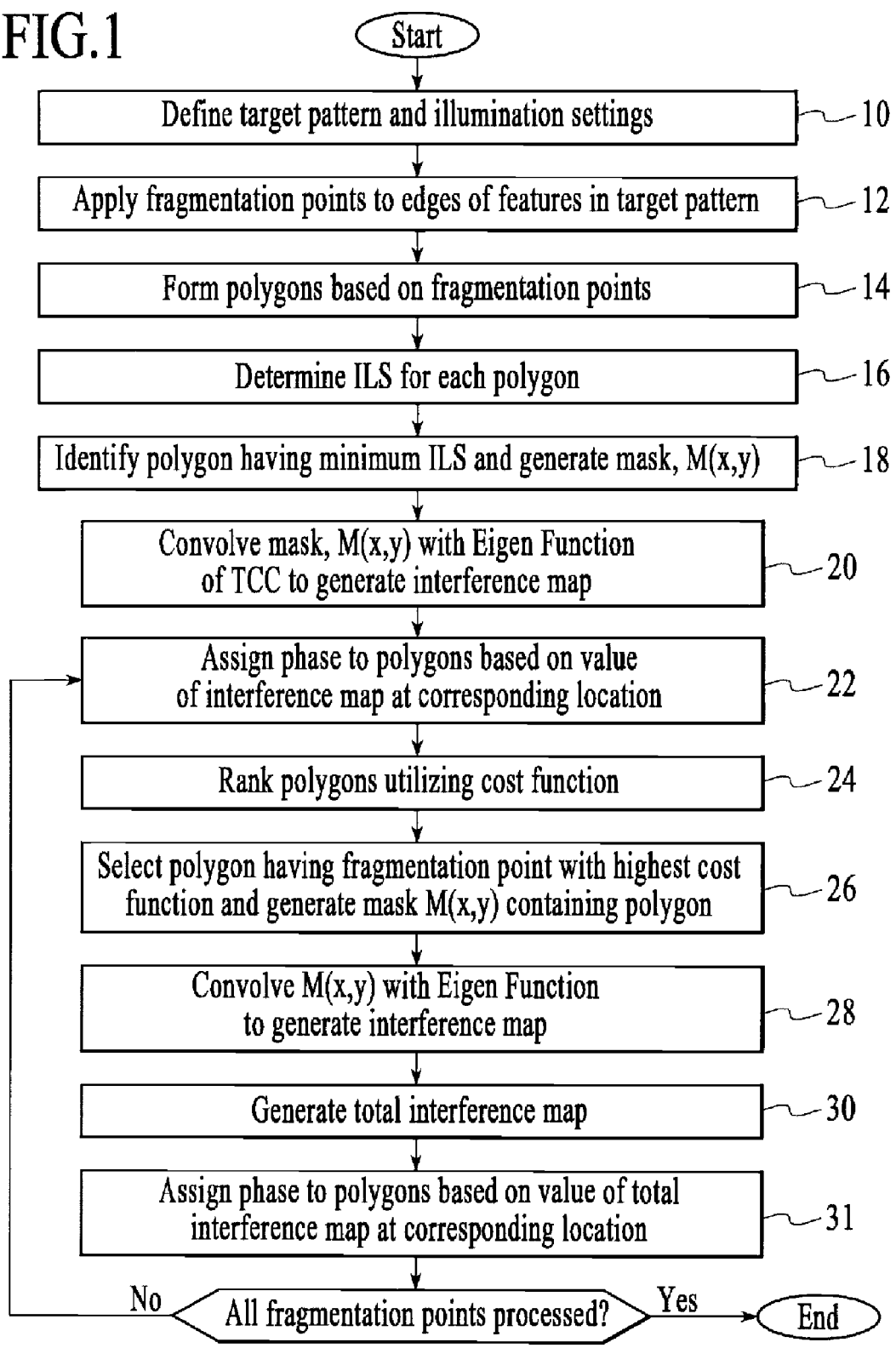
FIG. 1 is an exemplary flowchart illustrating the model based coloring process of the present invention, which is utilized to decompose a target pattern into multiple segments, which are then utilized in a multiple illumination process.

Referring to FIG. 1, which is an exemplary flowchart of the model based coloring process, the first step in the process (Step 10) is to define the target pattern (i.e., the pattern to be imaged on the substrate) and the illumination settings that will be utilized to image the target pattern. The target pattern is preferably described in a data format, such as "gds", which is a standard data format. However, any other suitable data format can also be utilized. In the example set forth herein, the target pattern is represented by equation O(x,y), where x and y represent locations within the target pattern.

Figure 2:
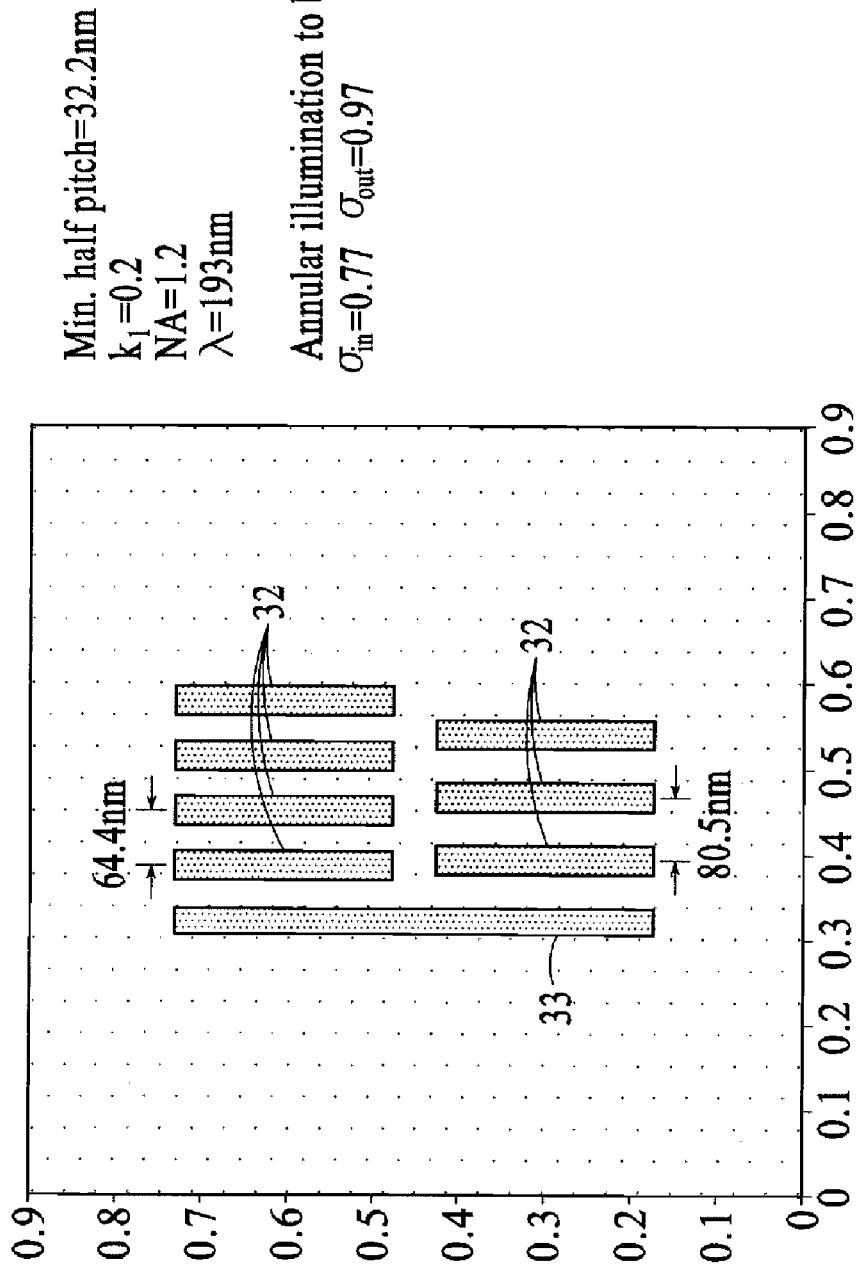
FIG. 2 illustrates an exemplary target pattern that will be decomposed into multiple segments utilizing the coloring process of the present invention.

FIG. 2 illustrates the exemplary target pattern that will be utilized to illustrate the model based coloring process. As shown, the target pattern includes a plurality vertical features 32, and a single long vertical feature 33. It is noted that the illumination settings include, for example, but are not limited to, type of illumination (i.e., annular, quadrature, off-axis, etc.), $\lambda$ (wavelength of source), NA (numerical aperture of projection lens), etc. In the given example, the pitch of the features 32, 33 is 64.4 nm or 80.5 nm as shown, $k_1$=0.2, $\lambda$=193 nm, NA=1.2 and annular illumination is being utilized, with $\sigma_{IN}$=0.77 and $\sigma_{OUT}$=0.97.

Figure 3:
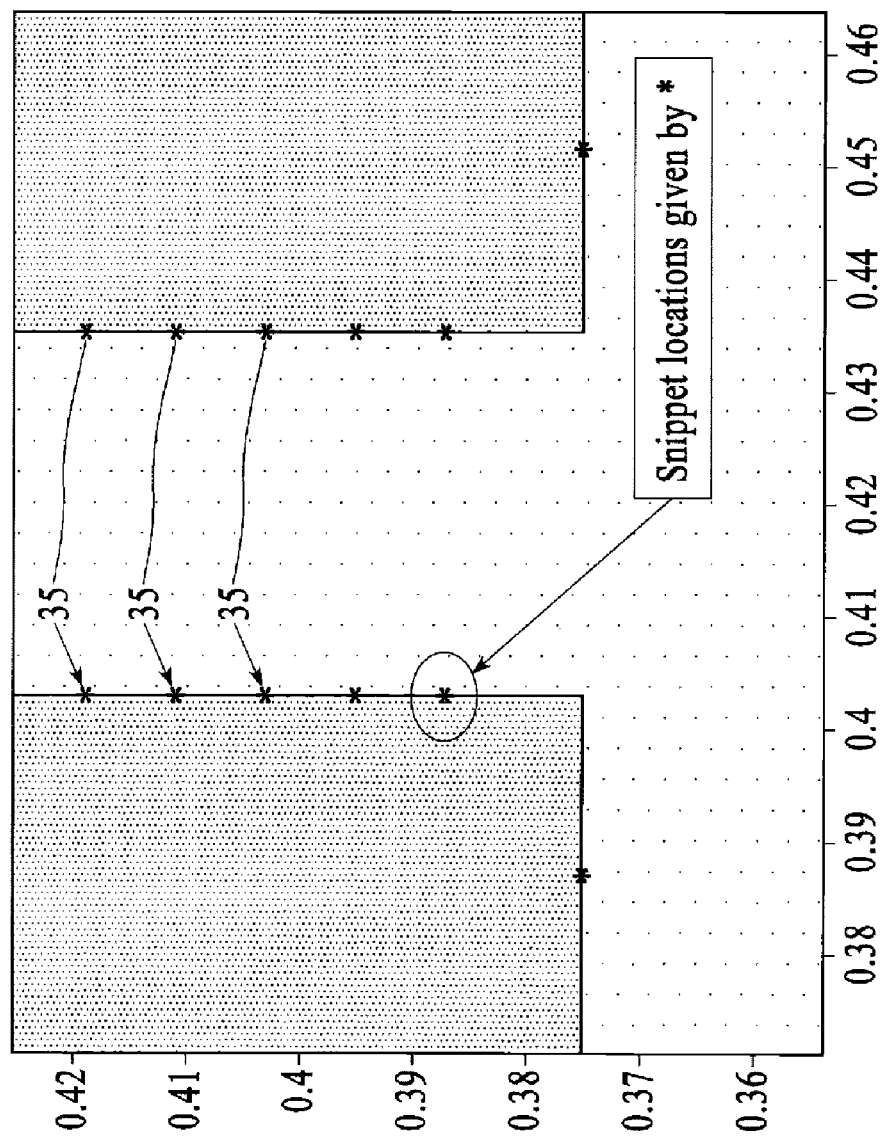
FIG. 3 illustrates Step 12 of the coloring process of the present invention, in which fragmentation points are defined.

The next step in the process (Step 12) is to apply fragmentation points 35 (also referred to as snippets) to the edges of the features 32, 33 in the target pattern O(x,y). The fragmentation points 35 are spaced around the edges of the features 32, 33 and function to define a plurality of smaller edges. In the given example, as shown in FIG. 3, the fragmentation points 35 are disposed so as to be spaced equally around each feature's edge, however, different schemes for placing fragmentation points may be utilized.

Figure 4:
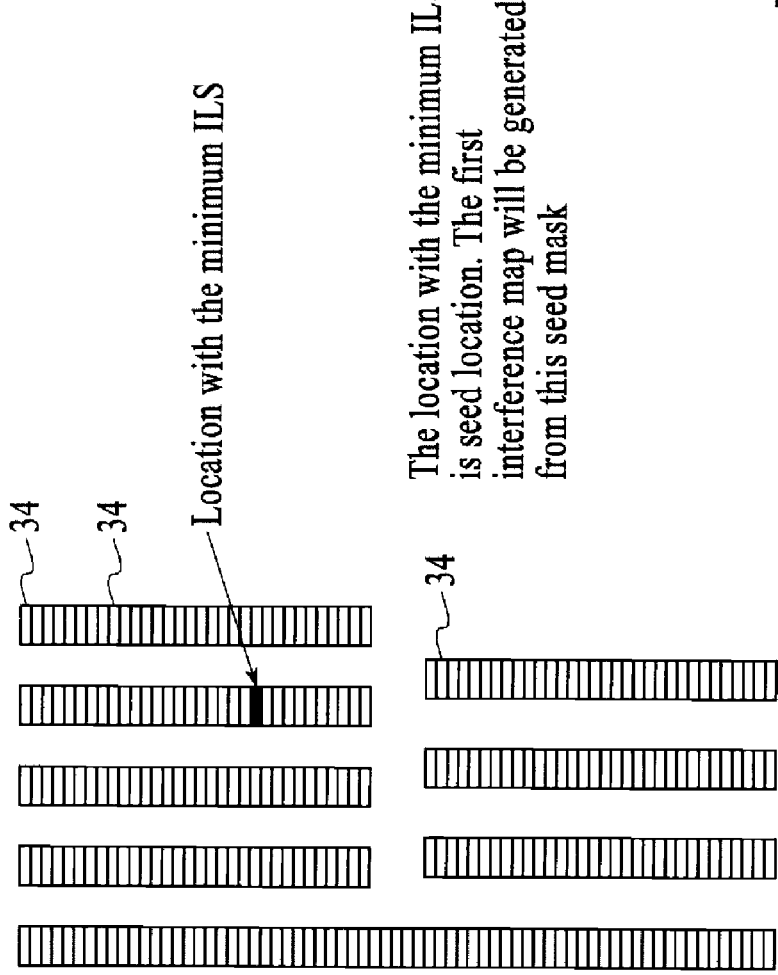
FIG. 4 illustrates Step 14 of the coloring process, in which multiple polygons are defined based on the fragmentation points defined in Step 12.

Referring to FIG. 4, once the fragmentation points 35 are defined, in the next step (Step 14), the fragmented edges are grouped so as to form a plurality of polygons 34. In other words, the target pattern and features contained therein are divided (i.e. represented) by a plurality of smaller polygons 34. FIG. 4 illustrates how each of the features 32, 33 of the target pattern are represented by a plurality of smaller polygons 34. It is noted that adjacent polygons may share a common edge. The polygons are represented by the equation P(x,y), where x and y represent locations within the target pattern. Initially, each of the polygons is assigned a transmission of 1 and a phase of 0°. As explained in further detail below, the phase assigned to a given polygon (e.g., 0° or 180°) will be utilized to indicate whether the given polygon, P(x,y), will be imaged in a first exposure or a second exposure. It is also noted that assigning a phase is merely one technique for designating which exposure a given polygon will be assigned to. For example, it is also possible to assign a color designation to each of the given polygon, where the color designation indicates which exposure the polygon is assigned. The color can be also assigned by applying a threshold other than zero to the eigenfunction, or the color can be assigned by applying a linear operator to the eigenfunction such as differentiation.

In the next step in the process, (Step 16), the image log slope (ILS) is calculated for each polygon (preferably at the center of the unshared polygon edges) utilizing the illumination settings defined in Step 10. As is known, the ILS can be calculated as: ILS(x,y)=$\hat{n} \cdot \nabla \{\ln[I(x,y)]\}$. It is noted that in the preferred embodiment the entire target pattern is not considered at the same time during this step. A coherence radius for a first geometry area of interest is defined, and the ILS for all the polygons within the coherence radius are calculated. Once this is done, the ILS for all polygons within the coherence radius for the next geometry area of interest are calculated. This process continues until all the areas of interest, which may be, for example, areas deemed critical by the mask designer, or simply the entire target pattern, are processed and ILS's for each polygon contained therein are processed. In the preferred embodiment, the coherence radius is defined as 4$\lambda$/NA. It is noted that when the ILS is computed for a given polygon, the polygon is centered within the coherence radius.

Figure 5:
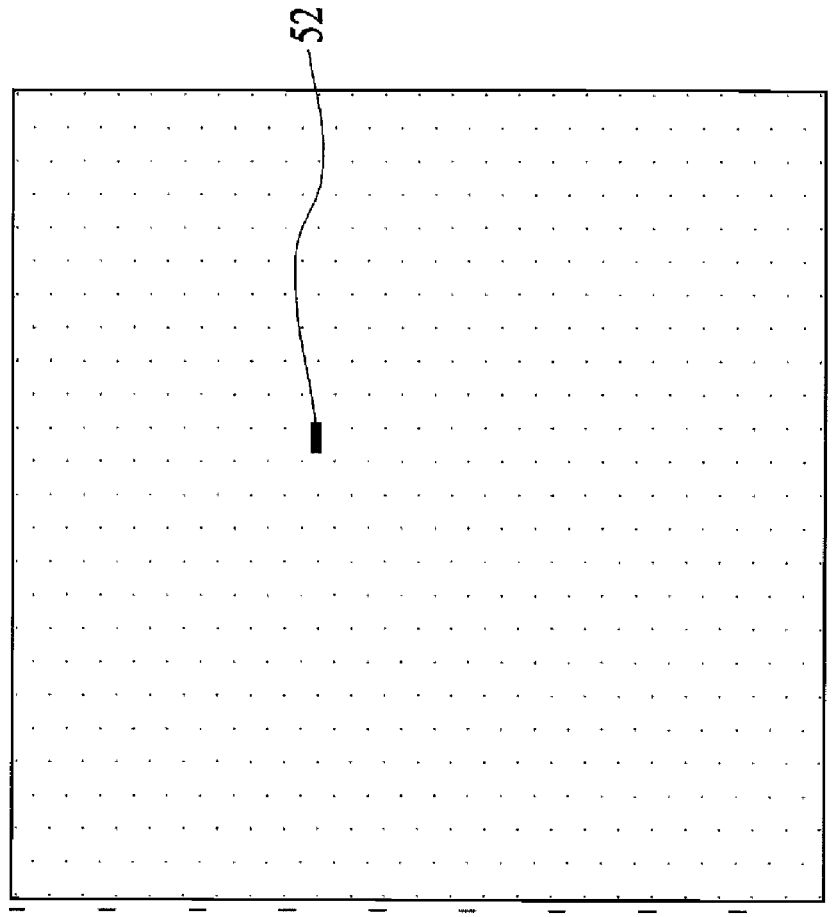
FIG. 5 illustrates Step 18 of the coloring process, in which a mask is defined which comprises the single polygon having the lowest ILS.

The next step (Step 18) of the process entails identifying the polygon that has the minimum ILS, and generating a mask, M(x,y), containing that single polygon. It is noted that similar to Step 16, when determining the polygon having the minimum ILS, only the polygons within the given coherence radius are considered. The process is repeated until all areas of interest have been processed. It is noted that the mask, M(x,y) is defined utilizing standard data formats, such as "gds", noted above. FIG. 5 illustrates an exemplary mask generated by Step 18. As shown, the mask contains only a single polygon 52.

It is noted that the pattern to analyze first can be chosen in a number of ways. In one example, the user can specify a pattern that is of the most interest. The ILS is evaluated for each fragmentation point in the pattern, and the coherence radius is centered at the fragmentation point with the lowest ILS. As another example, for a full-chip run, the user can first try to use a rule based decomposition of the pattern. However, often rule based methods fail to successfully decompose the full-chip, and user intervention is required to decompose (i.e., split) these areas of failure. Instead of requiring user intervention, the areas of failure can be processed with the model based method of the present invention. If there is more than one area of failure, the area with the lowest ILS value is evaluated first. The next failed area with the second lowest ILS is evaluated next. The coherence radius is then placed around the failed area with second lowest ILS.

Continuing, the next step in the process (Step 20) is to convolve the mask, M(x, y), defined in Step 18 with the first eigen function (i.e., the highest value eigen function $\Phi(x, y)$) of the transmission cross coefficient (TCC) defining the illumination system so as to generate a first (i.e., initial) interference map. As is known, the transmission cross coefficient, TCC, is the autocorrelation of the illumination pupil with the projection pupil, described, for instance, by M. Born and E. Wolf, Principles of Optics 530 (6th ed., Pergamon Press), incorporated herein by reference. In other words, the TCC represents the image transfer function of the optical system. The TCC is orthogonalized into a set of eigen functions, which also represent the illumination system. As noted above, the mask, M(x, y), is convolved with the eigen function having the highest eigen value. The result is the initial interference map, $F_1(x, y)$. Thus, $F_1(x, y)$ can be defined as:

$$F_1(x,y) = M(x,y) \otimes \Phi_1(x,y) \quad \text{Eq. (1).}$$

It is noted that interference maps are well known and are described, for example, in U.S. patent application Ser. No. 10/756,830, which is incorporated by reference herein. As described therein, the interference map corresponds to the e-field in the image plane and is capable of indicating both positive and negative energy.

Figure 6:
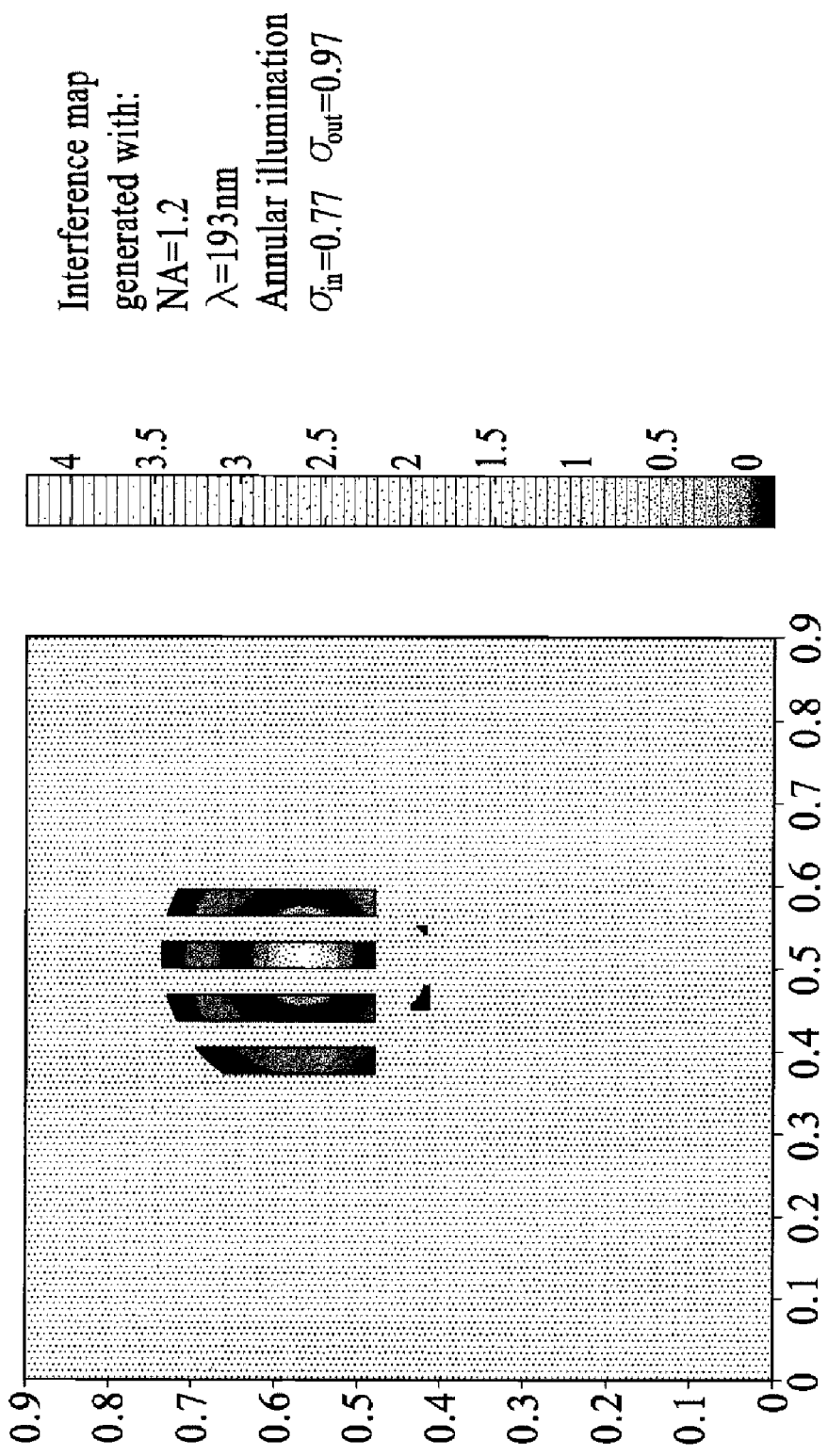
FIG. 6 illustrates Step 20 of the coloring process, in which an interference map is defined for the single polygon defined in Step 18.

FIG. 6 illustrates the result of the foregoing convolution (i.e., interference map) for the mask, M(x, y), of FIG. 5 with the highest eigen value, $\Phi_1(x, y)$, for the illumination system noted above. Referring to FIG. 6 and the scale adjacent thereto, the interference map illustrates which portions of the mask pattern have positive values and which portions have negative values. Any polygon segment 34 that resides in a positive area (i.e., an area of constructive interference) is assigned a first phase (e.g., 0°) and any polygon segment 34 that resides in a negative area (i.e., an area of destructive interference) is assigned a second phase (e.g., 180°). As explained in further detail below, the phase values of a given polygon segment can change during the course of the coloring process. However, once the process is completed, the phase assigned to the given polygon segment at the completion of the process will be utilized to define which of the multiple illuminations the given polygon segment will be subjected to. For example, if the features are being decomposed into first and second reticles, the phase assigned to a given polygon will determine which reticle the given polygon segment is formed in.

The foregoing process is accomplished in the coloring process (Step 22) by finding the center of mass for each polygon segment 34, $P_i(x, y)$ in P(x, y), and defining these points as $(x_{ci}, y_{ci})$. Then, if $F(x_{ci}, y_{ci})$ of the interference map is negative, the polygon segment, $P_i(x, y)$, is assigned a phase of 180°, and if $F(x_{ci}, y_{ci})$ of the interference map is positive or zero, the polygon segment, $P_i(x, y)$, is assigned a phase of 0°. In the given embodiment, the phase is being utilized to identify whether or not the given polygon is in a positive or negative area of the interference map, and subsequently, which exposure the given polygon segment 34 should be subjected to during the multiple exposure process.

Figure 7:
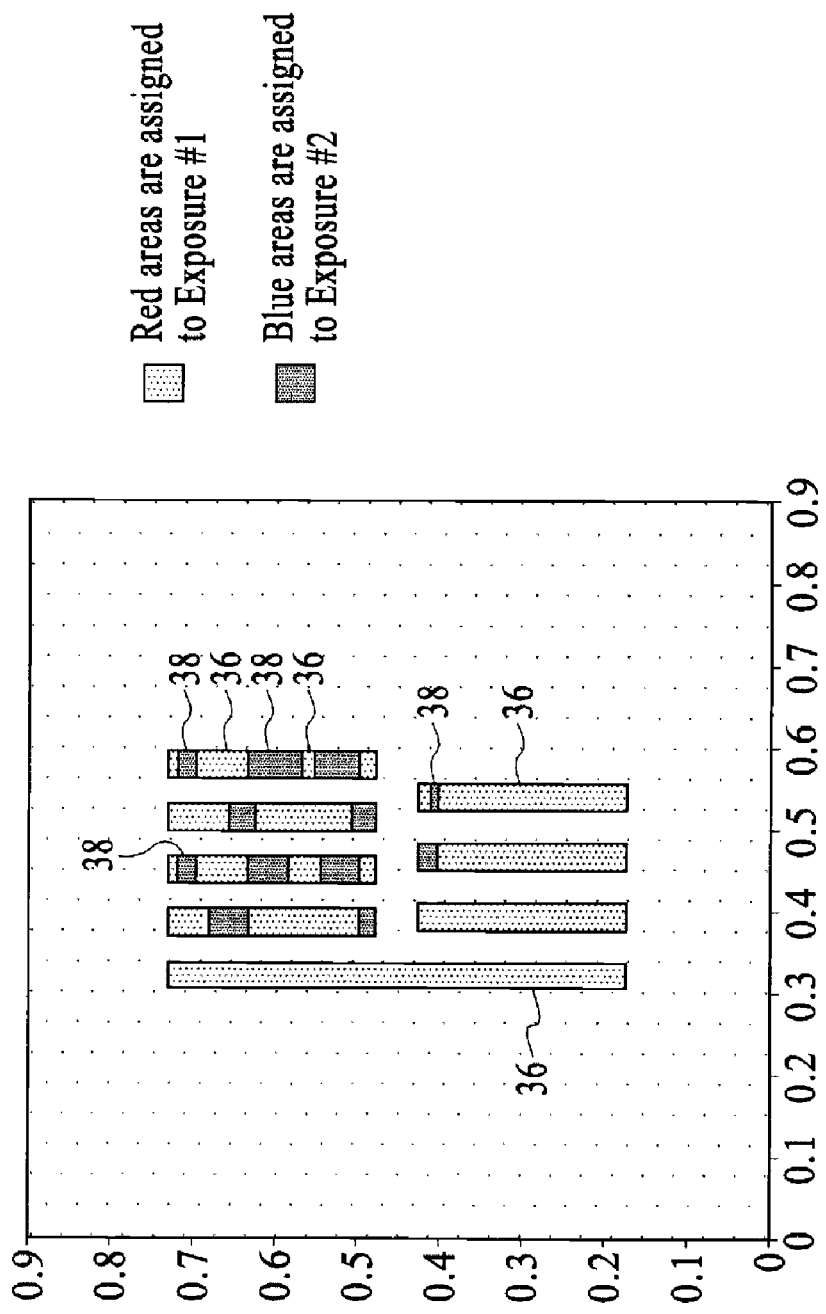
FIG. 7 illustrates how the areas of the target mask would be defined into separate exposures based on the interference map illustrated in FIG. 6.

FIG. 7 illustrates the resulting mask layout, P(x, y), after only a single iteration (i.e., consideration of only the single polygon segment 34 illustrated in FIG. 5). Referring to FIG. 7, the lighter areas 36 indicate areas where the interference map, $F_1(x, y)$, is positive, while the darker areas 38 indicates areas where the interference map, $F_1(x, y)$, is negative. Thus, in accordance with the method of the present invention, the lighter areas 36 would be imaged in a first exposure, and the darker areas 38 would be imaged in a second exposure. However, the initial interference map only considered a single polygon segment 34. In order to effectively consider all of the polygon segments 34 within the coherence radius, an iterative process must be performed.

In other words, the foregoing steps (Steps 10-22) generate the initial interference map, $F_1(x,y)$, and the initial polygon mask P(x,y). After performing these steps, the remaining portion of the coloring process entails performing the following iterative process. First, the polygon segments in $P_i(x,y)$ are first ranked by means of a cost function. It is noted that many optical parameters or physical parameters can be chosen to generate a suitable cost function. One exemplary cost function is a Gaussian function, which is a function of ILS and a function of the distance from the point with the minimum ILS, $(\bar{r}_o)$. Such a cost function, which is utilized in this example, can be defined as:

$$g[ILS, f(\bar{r} - \bar{r}_o)] \quad \text{Eq. (2).}$$

The cost function is a mathematical representation that orders the fragmentation points from most important to least important. The algorithm begins by evaluating the most important fragmentation point, i.e., the point with the highest cost function. One possible cost function, g, has variables ILS and distance $(r - r_o)$. The cost function used here is $g_i = [\max(ILS) - ILS_i] \cdot e^{-(\bar{r}_i - \bar{r}_o)^2/a^2}$ where i is the index of the fragmentation point. It is noted that other metrics can also be used in the cost function, such as, but not limited to, the gradient of the intensity, exposure latitude (EL), mask error enhancement factor (MEEF), intensity, and depth of focus (DOF).

The cost function is a mathematical representation that orders the fragmentation points from most important to least important. The algorithm begins by evaluating the most important fragmentation point, i.e., the point with the highest cost function. One possible cost function, g, has variables ILS and distance $(r - r_0)$. The cost function used here is $g_i = ILS_i \cdot e^{-(\bar{r}_i - \bar{r}_o)^2/a^2}$ where i is the index of the fragmentation point.

In the next step (Step 24), the cost function is applied to each fragmentation point of the polygons, $P_i(x, y)$, within the coherence radius, and the fragmentations points are ranked so as to indicate the fragmentation points having the highest cost function to the lowest cost function. The higher the ranking of a fragmentation points means the more difficult it is to print the point. It is noted that if the ILS of a fragmentation point is less than zero, the fragmentation point is extremely problematic, i.e, the fragmentation point will be removed during develop or the fragmentation point will bridge to another fragmentation point. Such fragmentation points with a negative ILS can be assigned a higher cost function. A fragmentation point with the higher cost function will be evaluated prior to the fragmentation points with the lowest cost function. This ensures that problematic areas will be separated into multiple exposures and will improve the pattern fidelity after multiple exposures.

It is noted that once the cost function is defined, the initial interference map determined in Step 20 is weighted by the cost function. Therefore, the initial interference map becomes:

$$F_{total}(x,y) = F_1(x,y) \cdot g[ILS_1, f(\bar{r}_i - \bar{r}_o)] \quad \text{Eq. (3)}$$

Figure 8:
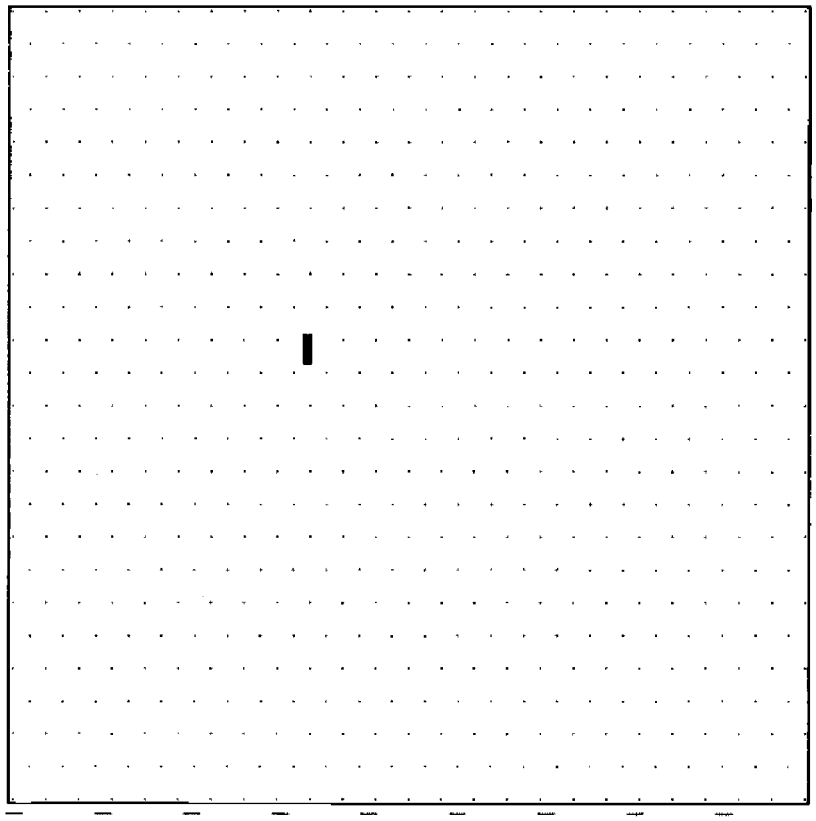
FIG. 8 illustrates Step 26 of the coloring process, in which a mask containing the polygon with the next highest cost function within a predefined coherence radius is defined.

Continuing, in the next step of the process (Step 26), the polygon segment 34 having the fragmentation point with the highest cost function is selected, and a mask is created with this single polygon, M(x, y), using the phase of this polygon that was defined as a result of initial interference map generated in Step (22). It is noted that after the coloring process performs this step the first time, the phase of the polygon to be utilized in the step will be defined by the total interference map updated with the previous iteration (i.e., the interference map generated by Step (30) as detailed below). FIG. 8 illustrates the mask formed in accordance with this step for the exemplary target pattern.

In the next step (Step 28) of the process, similar to Step 20, the mask, M(x, y) generated by Step 26 is convolved with the eigen function, $\Phi(x, y)$, so as to generate a second interference map, $F_{i+1}(x, y)$. Then, in Step 30, the interference map, $F_{i+1}(x, y)$, generated in Step 28 is added to the initial interference map, $F_i(x, y)$, multiplied by the cost function, $g[ILS, f(\bar{r}-\bar{r}_o)]$, so as to create the total interference map:

$$F_{total}(x, y) = \sum_{i=1}^{N} F_i(x, y) \cdot g[ILS_i, f(\bar{r}_i - \bar{r}_o)] \qquad \text{Eq. (4)}$$

Figure 9:
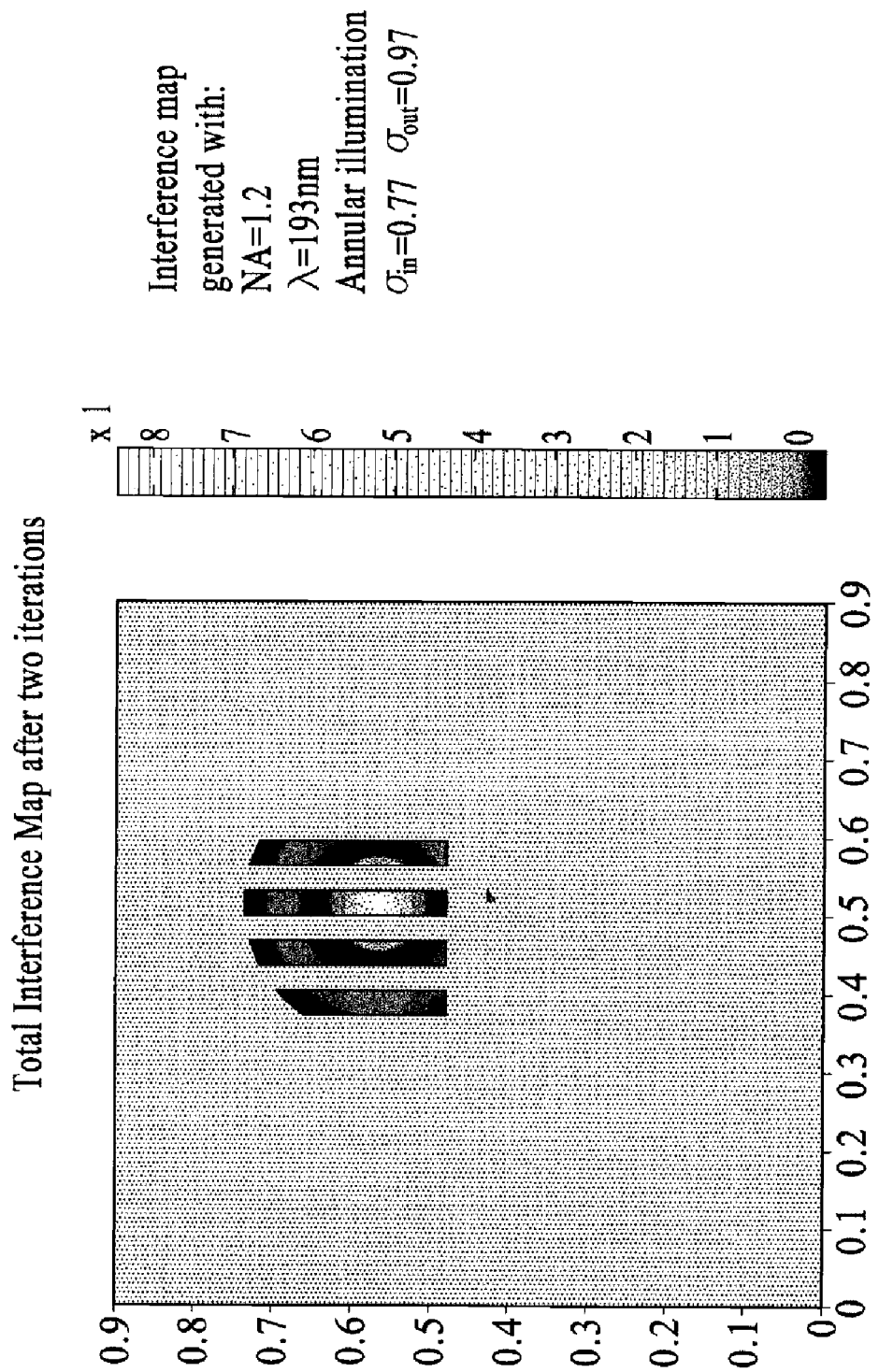
FIG. 9 illustrates Step 30 of the coloring process, in which an interference map representing the combination of the single polygon having the lowest ILS and the polygon select in Step 26 is defined.

Then, in the next step (Step 31), as with Step 22, the center of mass for each polygon segment $P_i(x,y)$ in $P(x,y)$ is determined, and these points are referred to as $(x_{ci}, y_{ci})$. Then, as in Step 22, if $F_{total}(x_{ci}, y_{ci})$ of the interference map is negative, the given polygon segment, $P_i(x,y)$, is assigned a phase of 180°, and if $F_{total}(x_{ci}, y_{ci})$ of the interference map is positive or zero, the given polygon segment, $P_i(x,y)$, is assigned a phase of 0°. FIG. 9 illustrates the resulting interference map after the second iteration, and FIG. 10 illustrates the corresponding mask layout, $P(x, y)$, defined by the interference map of FIG. 9.

Thereafter, the fragmentation point selected in Step 26 is removed from the list of ranked fragmentation points, and the process returns to Step 22 and Steps 22-32 are performed again for the newly selected fragmentation point. This reiterative process continues until all fragmentation points are considered and processed.

Figure 10:
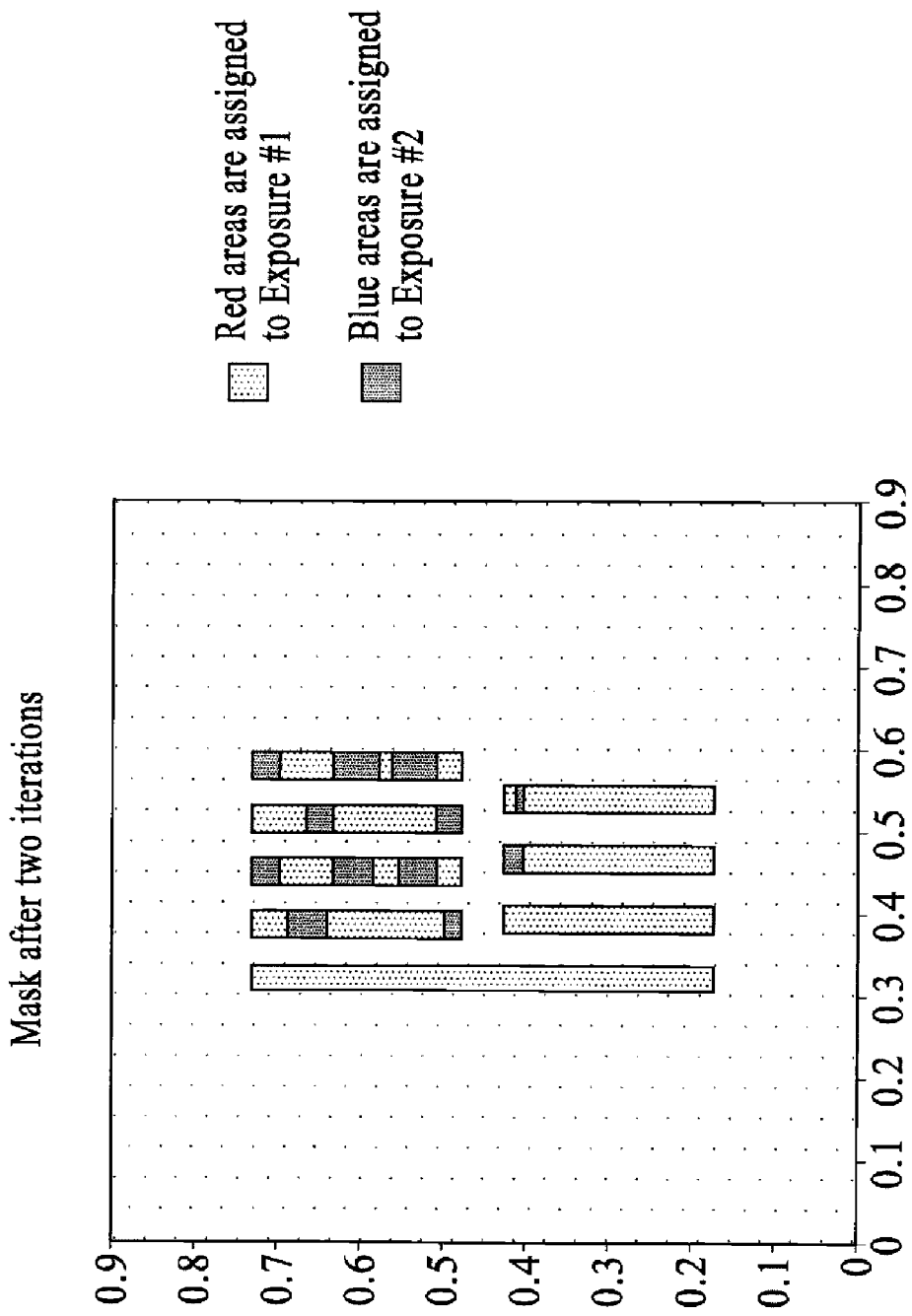
FIG. 10 illustrates how the areas of the target mask would be defined into separate exposures based on the interference map illustrated in FIG. 9.
Figure 11:
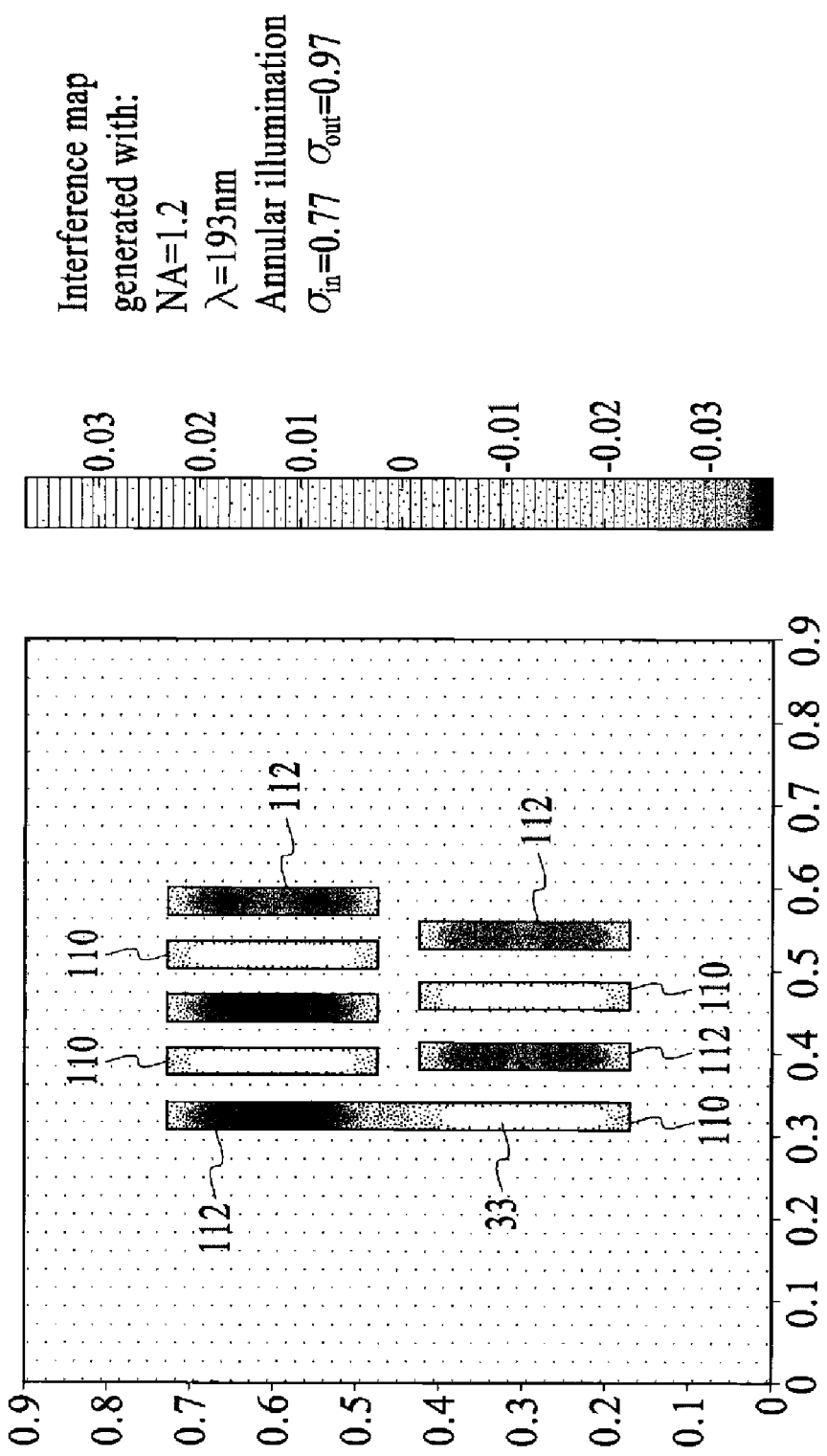
FIG. 11 illustrates the total interference map after all polygons have been processed.
Figure 12:
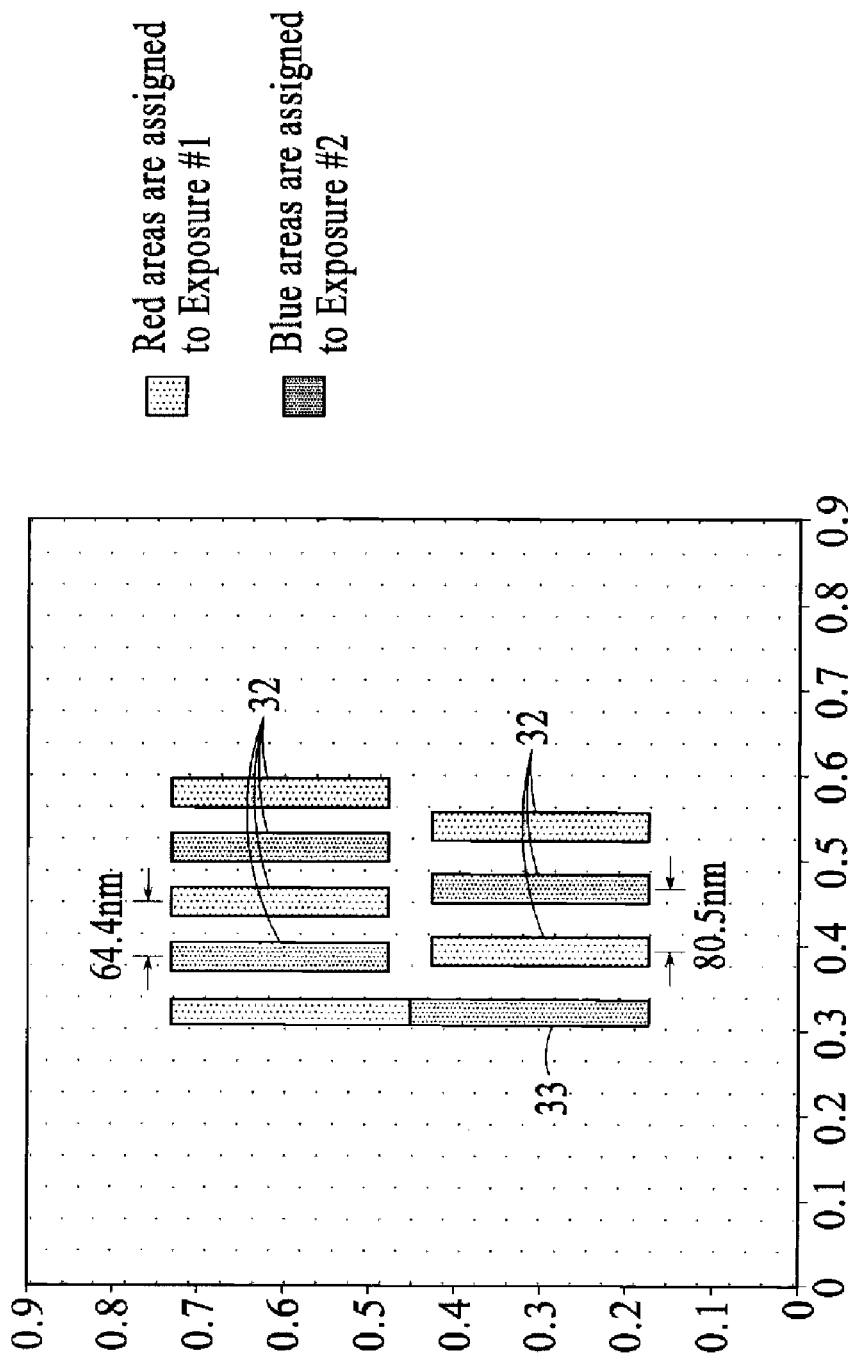
FIG. 12 illustrates how the areas of the target mask would be defined into separate exposures based on the interference map illustrated in FIG. 11.

FIG. 10 illustrates the mask resulting from two iterations of the foregoing process. As can be seen from a comparison between FIG. 7 and FIG. 10, there are small differences between the two resulting mask patterns. However, FIG. 11 illustrates the interference map generated by the process of the present invention after all iterations are completed. Referring to FIG. 11, the interference map resulting for the given example clearly indicates which features, and portions of features, exhibit positive values (see, reference numerals 110) and which features, and portions of features, exhibit negative values (see, reference numerals 112). As a result, the coloring process can readily and automatically determine which features should be imaged in a first exposure (those features exhibiting positive values) and which features should be imaged in a second exposure (those features exhibit negative values). It is important to note that the process allows a single feature to be decomposed into multiple segments. Referring to FIG. 11, it is clear that a portion of feature 33 will be imaged in one exposure, while another portion of the same feature will be imaged in a second exposure. FIG. 12 illustrates the mask layout assignment resulting from the interference map of FIG. 11. As shown, in the given example, the light areas would be assigned to a first mask and subjected to a first exposure and the dark areas would be assigned to a second mask and subjected to a second exposure.

It is noted that in order to print features with a $k_1 < 0.25$, a non-linear transfer into the imaging medium is necessary. This can be achieved with a non-linear photoresist or this can be achieved with an etch after the first exposure. It is also noted that it is possible to utilize two masks to print features with a $k_1 \geq 0.25$. In order to print features with $k_1 \geq 0.25$, a non-linear transfer into the imaging medium is not necessary. In one embodiment, the wafer is first exposed with the first mask, and the wafer is left on the wafer chuck. Then, the reticle holder is switched to the second mask, and the wafer is exposed with the second mask.

Figure 13:
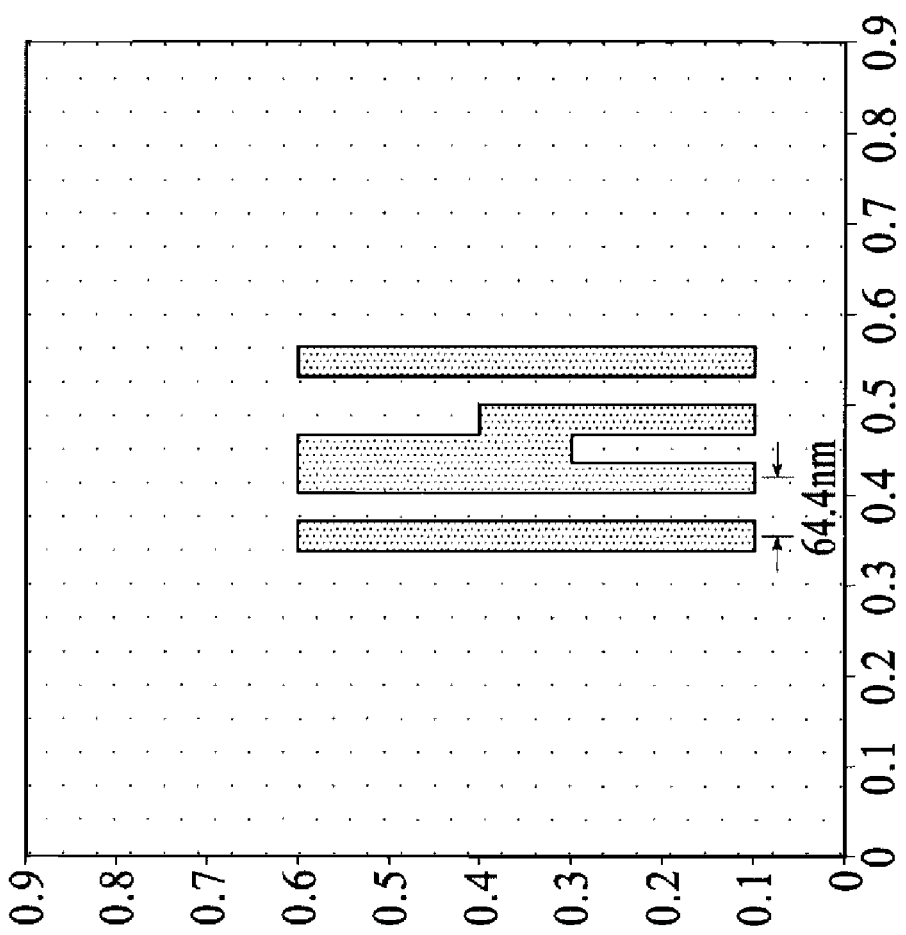
FIG. 13 illustrates a second exemplary target pattern.
Figure 14:
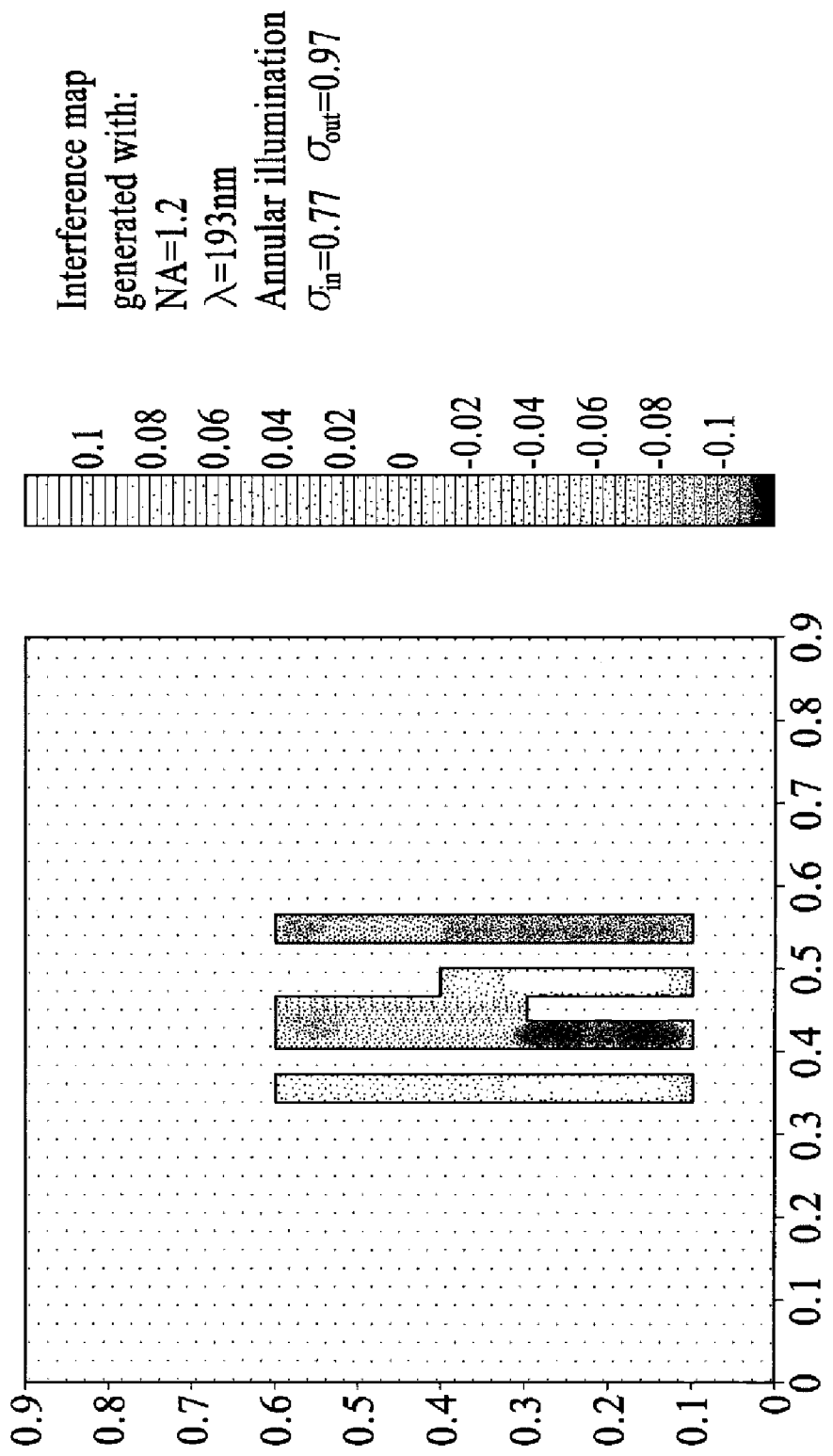
FIG. 14 illustrates the interference generated by the process of the present invention corresponding to the target pattern of FIG. 13.
Figure 15:
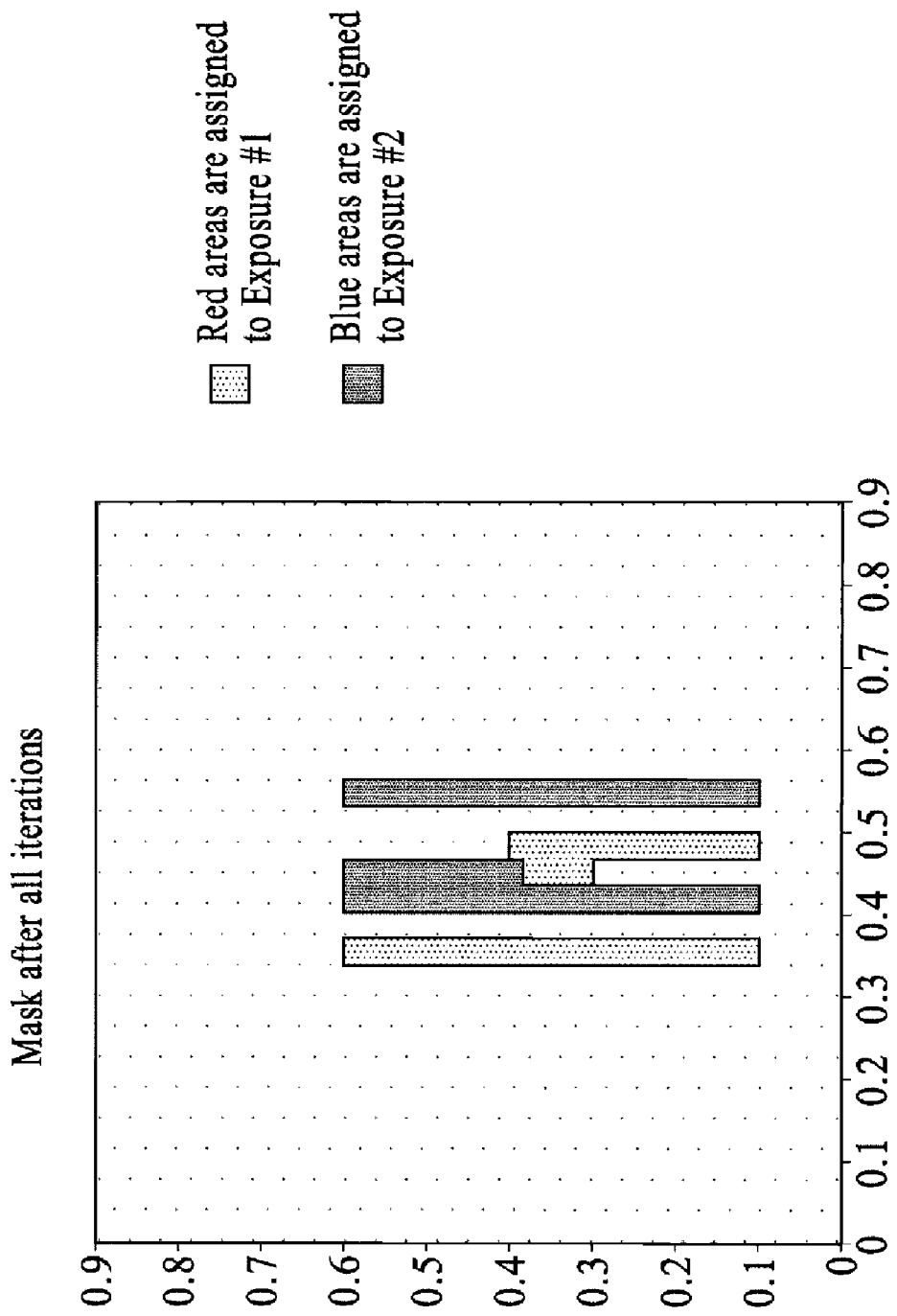
FIG. 15 illustrates how the areas of the target mask would be defined into separate exposures based on the interference map illustrated in FIG. 14.

FIG. 13 illustrates another exemplary target pattern that was subjected to the decomposition process of the present invention. FIG. 14 illustrates the final interference map generated by the process for the target pattern. Once again, by assigning the features or portions of the features to one of two exposures based on the value of the corresponding area in the interference map, the target pattern is readily decomposed into first and second exposure areas by the process of the present invention. The mask layout associated with the interference pattern of FIG. 14 is illustrated in FIG. 15.

Variations of the foregoing process are also possible. For example, it is possible to divide/assign the polygons into more than two categories and utilize more than two exposures to image the resulting mask layout. It is also noted that the techniques of the present invention can be utilized with either dark field masks or clear field masks. The techniques of the present invention can also be utilized as a model-based coloring algorithm for alternating phase-shift masks. Further, it is also noted that the techniques of the present invention can be utilized in conjunction with ASML's previously disclosed illumination optimization techniques or ASML's illumination and source optimization techniques.

As noted above, the present invention provides important advantages over the prior art. Most importantly, the present invention provides a model based coloring process for decomposing the features of a target pattern into distinct segments which can be imaged separately, for example, by utilizing multiple masks. In addition, the model based coloring process of the present invention allows for a single feature of the target pattern to be automatically separated/divided into multiple segments which can be also be imaged separately. Furthermore, the method of the present invention advantageously can decompose a 2D pattern with $k_1 = 0.177$ into two exposures. If more than two exposures is used, the present invention can decompose a 2D pattern with $k_1 < 0.177$. Finally, it is noted that the distance between features and/or segments in a given exposure mask should be greater that the minimum resolvable pitch of $2k_1 \lambda / NA$.

Figure 16:
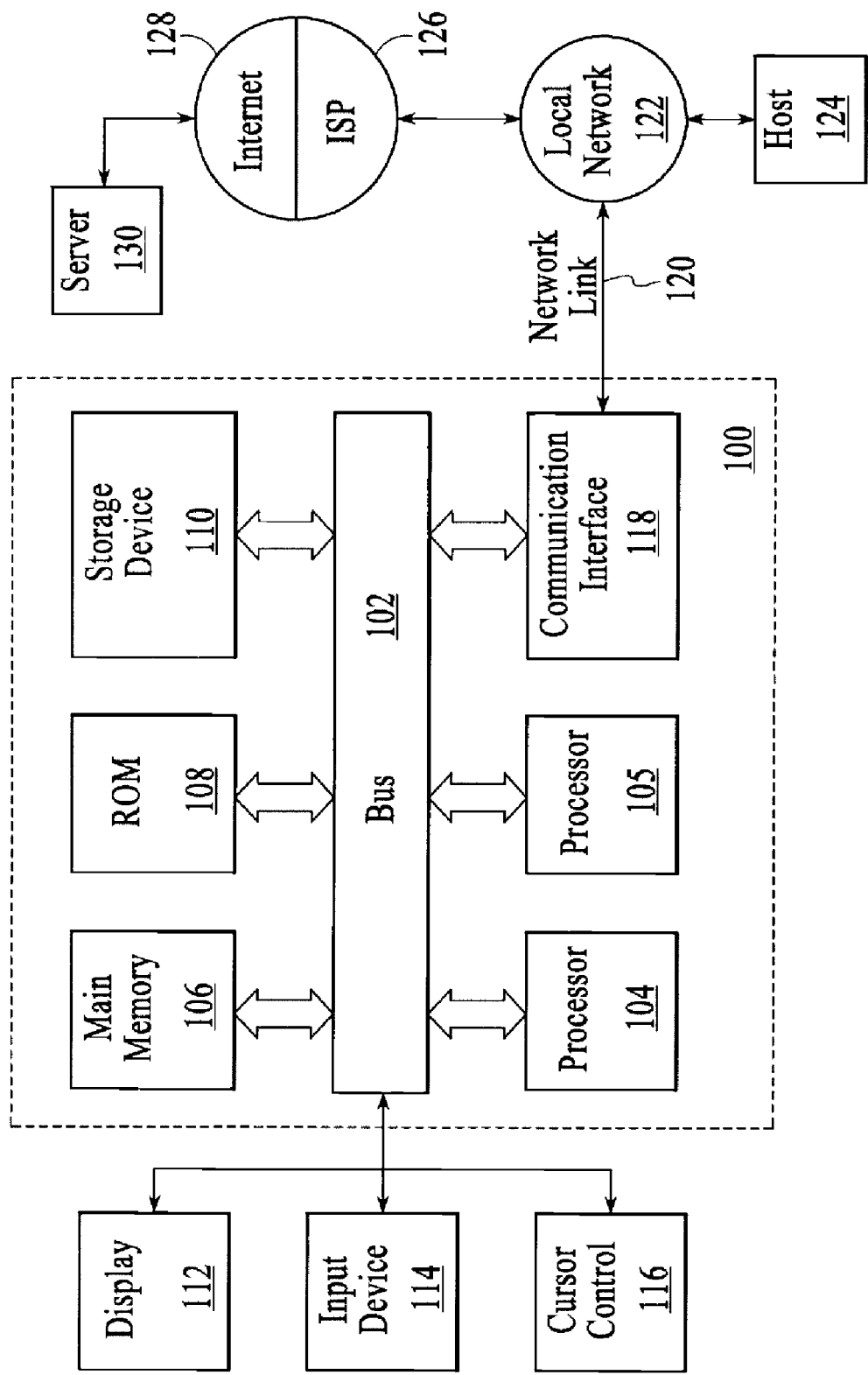
FIG. 16 is a block diagram that illustrates a computer system which can implement illumination optimization according to an embodiment of the present invention.

FIG. 16 is a block diagram that illustrates a computer system 100 which can implement the illumination optimization explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 17:
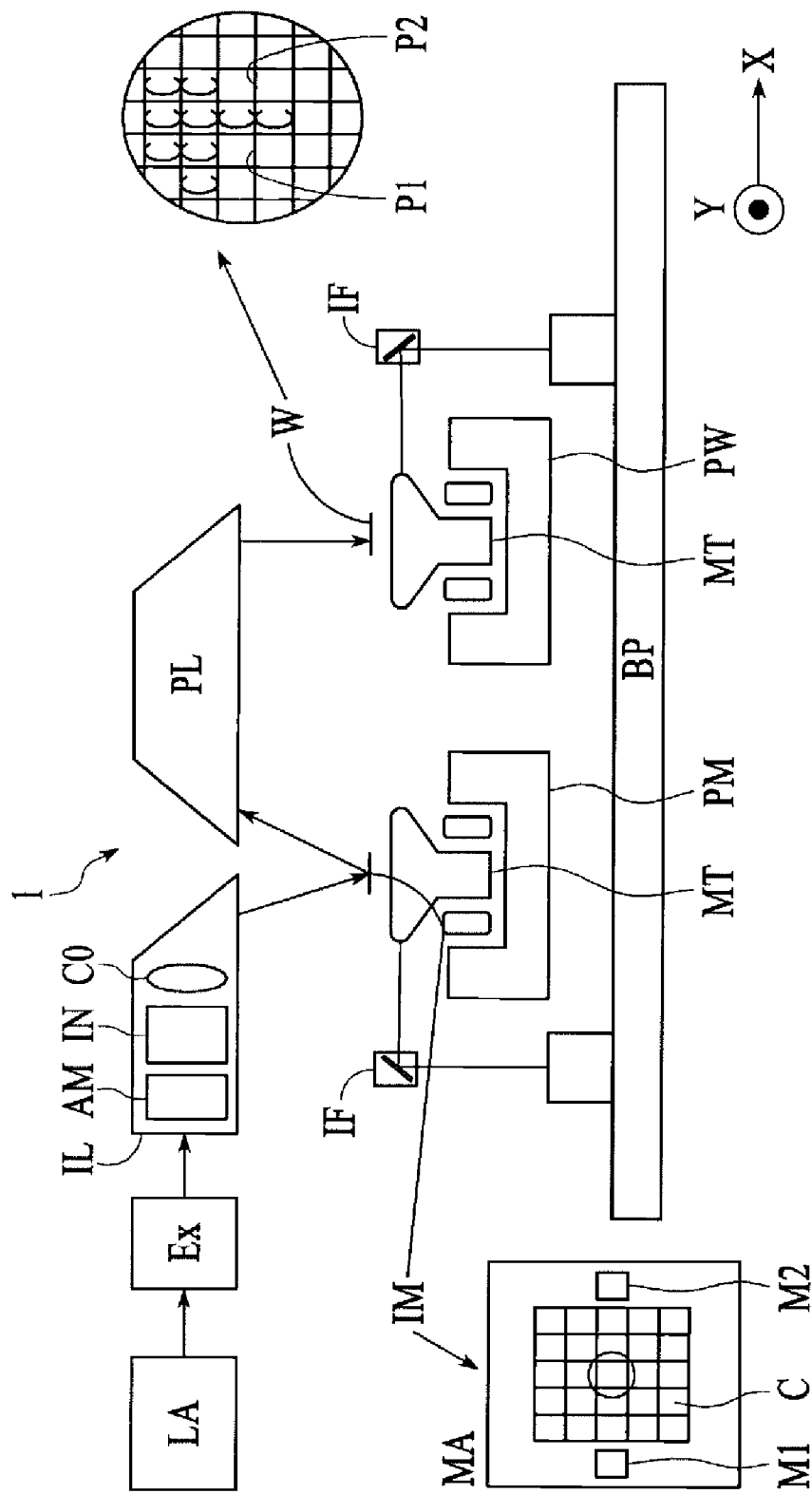
FIG. 17 schematically depicts an exemplary lithographic projection apparatus suitable for use with a mask designed with the aid of the disclosed concepts.

FIG. 17 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 17 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 17. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of decomposing a target pattern having features to be imaged on a substrate so as to allow said features to be imaged in a multi-exposure process, said method comprising the steps of:
   (a) segmenting a plurality of said features into a plurality of polygons;
   (b) determining the image log slope (ILS) value for each of said plurality of polygons;
   (c) determining the polygon having the minimum ILS value, and defining a mask containing said polygon;
   (d) convolving said mask defined in step (c) with an eigen function of a transmission cross coefficient so as to generate a first interference map, said transmission cross coefficient defining an illumination system; and
   (e) assigning a phase to said polygons based on the value of the first interference map at a location respectively corresponding to said polygons, said phase defining which exposure in said multi-exposure process said polygons are assigned.

2. The method of decomposing a target pattern according to claim 1, further comprising the steps of:
   (f) selecting another polygon, and defining a mask containing said polygon;
   (g) convolving said mask defined in step (f) with said eigen function of said transmission cross coefficient so as to generate a second interference map;
   (h) generate a total interference map by combining said first interference map and said second interference map; and
   (i) assigning a phase to said polygons based on the value of the total interference map at a location respectively corresponding to said polygons, said phase defining which exposure in said multi-exposure process said polygons are assigned;
   wherein said steps (f)-(i) are repeated until all polygons have been processed.

3. The method of decomposing a target pattern according to claim 2, wherein step (f) comprises ranking the polygons utilizing a cost function, and the polygon having the highest cost function is selected as the next polygon for processing.

4. The method of decomposing a target pattern according to claim 2, wherein said polygons are assigned either a first phase or a second phase, said polygons assigned said first phase are to be imaged in a first exposure process and said polygons assigned said second phase are to be imaged in a second exposure process.

5. The method of decomposing a target pattern according to claim 4, wherein each polygon having a positive value in the corresponding location of the total interference map is assigned said first phase, and each polygon having a negative value in the corresponding location of the total interference map is assigned said second phase.

6. The method of decomposing a target pattern according to claim 2, wherein a single feature contained in said target pattern can be decomposed into multiple segments which are assigned different phases and which are to be imaged in different exposure processes.

7. A mask formed utilizing the method of claim 1.

8. A computer program product for controlling a computer comprising a recording medium readable by the computer, means recorded on the recording medium for directing the computer to decompose a target pattern having features to be imaged on a substrate so as to allow said features to be imaged in a multi-exposure process, the process comprising the steps of:
  (a) segmenting a plurality of said features into a plurality of polygons;
  (b) determining the image log slope (ILS) value for each of said plurality of polygons;
  (c) determining the polygon having the minimum ILS value, and defining a mask containing said polygon;
  (d) convolving said mask defined in step (c) with an eigen function of a transmission cross coefficient so as to generate a first interference map, said transmission cross coefficient defining an illumination system; and
  (e) assigning a phase to said polygons based on the value of the first interference map at a location respectively corresponding to said polygons, said phase defining which exposure in said multi-exposure process said polygons are assigned.

9. The computer program product of claim 8, wherein said process further comprising the steps of:
  (f) selecting another polygon, and defining a mask containing said polygon;
  (g) convolving said mask defined in step (f) with said eigen function of said transmission cross coefficient so as to generate a second interference map;
  (h) generate a total interference map by combining said first interference map and said second interference map; and
  (i) assigning a phase to said polygons based on the value of the total interference map at a location respectively corresponding to said polygons, said phase defining which exposure in said multi-exposure process said polygons are assigned;
  wherein said steps (f)-(i) are repeated until all polygons have been processed.

10. The computer program product of claim 9, wherein step (f) comprises ranking the polygons utilizing a cost function, and the polygon having the highest cost function is selected as the next polygon for processing.

11. The computer program product of claim 9, wherein said polygons are assigned either a first phase or a second phase, said polygons assigned said first phase are to be imaged in a first exposure process and said polygons assigned said second phase are to be imaged in a second exposure process.

12. The computer program product of claim 11, wherein each polygon having a positive value in the corresponding location of the total interference map is assigned said first phase, and each polygon having a negative value in the corresponding location of the total interference map is assigned said second phase.

13. The computer program product of claim 9, wherein a single feature contained in said target pattern can be decomposed into multiple segments which are assigned different phases and which are to be imaged in different exposure processes.

14. A device manufacturing method comprising the steps of:
  (a) providing a substrate that is at least partially covered by a layer of radiation-sensitive material;
  (b) providing a projection beam of radiation using an imaging system;
  (c) using a pattern on a mask to endow the projection beam with a pattern in its cross-section;
  (d) projecting the patterned beam of radiation onto a target portion of the layer of radiation-sensitive material,
  wherein, in step (c), said mask is formed by a method comprising the steps of:
  (e) segmenting a plurality of said features into a plurality of polygons;
  (f) determining the image log slope (ILS) value for each of said plurality of polygons;
  (g) determining the polygon having the minimum ILS value, and defining a mask containing said polygon;
  (h) convolving said mask defined in step (g) with an eigen function of a transmission cross coefficient so as to generate a first interference map, said transmission cross coefficient defining an illumination system; and
  (i) assigning a phase to said polygons based on the value of the first interference map at a location respectively corresponding to said polygons, said phase defining which exposure in said multi-exposure process said polygons are assigned.

* * * * *